United States Patent [19]
Sanchez et al.

[11] Patent Number: 5,917,358
[45] Date of Patent: Jun. 29, 1999

[54] METHOD AND OUTPUT BUFFER WITH PROGRAMMABLE BIAS TO ACCOMMODATE MULTIPLE SUPPLY VOLTAGES

[75] Inventors: Hector Sanchez, Cedar Park; Carmine Nicoletta; Joshua Siegel, both of Austin; Jose Alvarez, Leander, all of Tex.

[73] Assignee: Motorola, Inc., Schaumburg, Ill.

[21] Appl. No.: 08/987,361

[22] Filed: Dec. 9, 1997

[51] Int. Cl.$^6$ .......................................... H03L 5/00
[52] U.S. Cl. ............................. 327/333; 327/530
[58] Field of Search .................... 327/333, 319, 327/108, 112, 185, 535, 530, 538, 540; 326/62, 71, 80–83, 56

[56] References Cited

U.S. PATENT DOCUMENTS

| | | | |
|---|---|---|---|
| 5,136,190 | 8/1992 | Chern et al. | 326/81 |
| 5,304,872 | 4/1994 | Avraham et al. | 326/71 |
| 5,717,342 | 2/1998 | Lotfi et al. | 326/17 |
| 5,729,164 | 3/1998 | Pattantyus | 327/110 |
| 5,742,196 | 4/1998 | Fronen et al. | 327/382 |
| 5,801,569 | 9/1998 | Pinkham | 327/333 |

OTHER PUBLICATIONS

Ohtomo, et al., "A quarter–micron SIMOX–CMOS LVT-TL–compatible Gate Array with over 2,000 V ESD–protection circuit", IEEE Custom Integrated Circuits Conference, pp. 57–60 (1996).

*Primary Examiner*—My-Trang Nu Ton
*Attorney, Agent, or Firm*—Lee E. Chastain; Robert L. King

[57] ABSTRACT

Output buffer (100) translates input signals from one voltage range to a second voltage range. The second voltage range may be identical to the first range or may be greater. The particular range is programmable by one of several ways. This feature makes output buffer especially suitable for use in devices which must be compatible with two voltage ranges. Output buffer uses a bias generator (110) to limit the voltage across the gate oxide of its various transistors to a level which is consistent with the first voltage range.

19 Claims, 3 Drawing Sheets

METHOD AND OUTPUT BUFFER WITH PROGRAMMABLE BIAS TO ACCOMMODATE MULTIPLE SUPPLY VOLTAGES

FIELD OF THE INVENTION

This invention relates to electrical circuits, and more particularly, to digital output buffer circuits.

BACKGROUND OF THE INVENTION

Semiconductor technologies continuously evolve such that leading edge semiconductors have decreased geometries of transistor sizes and decreased voltages for voltage supplies. The smaller transistors are now manufactured with very thin gate oxide material. As a result, the dielectric breakdown voltage for such transistors has decreased. Thus, a decreased voltage supply is both desirable in order to reduce power consumption and necessary in order to avoid damaging the very thin gate oxide material. Also, even if a voltage supply does not immediately damage a transistor, it can be a benefit. A decreased voltage supply will increase the lifetime of the transistors to which it is connected. Meanwhile, other semiconductor products coupled to leading edge semiconductor products still have much higher breakdown voltage devices, and utilize higher supply voltages.

For many years, semiconductor designers have dealt with the problem of translating between various levels of supply voltages. For example, when technology transferred between TTL (Transistor to Transistor Logic) to MOS (Metal Oxide Silicon) technology there was a need for voltage level shifting to be performed between the TTL and MOS technologies. Additionally, as supply voltages gradually decreased from 15 Volts to 5 Volts to 3 Volts, designers created interface circuits which could operate between different voltage systems. However, most of those designs were focused on the issue of being able to just interface between one system operating at one voltage and a second system operating at a different voltage. Such systems typically did not have the problem of coping with breakdown voltages of transistors being threatened by the higher voltage system.

There are many chips and integrated circuits such as memories, memory controllers, and other peripherals that work with leading edge microprocessors. However, such peripherals and memories have not changed their supply voltages or reduced their voltage levels nearly as quickly as microprocessors have. In being able to interface between a peripheral circuit that has a much higher voltage than a leading edge integrated circuit, such as a microprocessor, designers often use a well biasing technique to try to minimize the impact in an integrated circuit of receiving a voltage signal much higher than the supply voltage intended for that integrated circuit. The well bias technique which is used eliminates a charge drain from the output node to an output stage power supply within the circuit. Prior circuits typically dealt with receiving higher voltage levels and using those voltage levels in a system operating at a lower voltage level. However, such systems did not typically worry about or have to compensate for transistor damage due to thin gate oxides. As technologies have evolved, the maximum voltage permitted across a transistor has decreased much faster than the decrease of supply voltages for the output bus. As a result, a need exists for a circuit and method which is able to guarantee the integrity of transistors and transistor gate oxides when interfacing with very high supply voltages at the output bus.

BRIEF DESCRIPTION OF THE DRAWINGS

The features and advantages of the present invention will be more clearly understood from the following detailed description taken in conjunction with the accompanying FIGS. where like numerals refer to like and corresponding parts and in which.

DETAILED DESCRIPTION OF THE DRAWINGS

Figure 1:
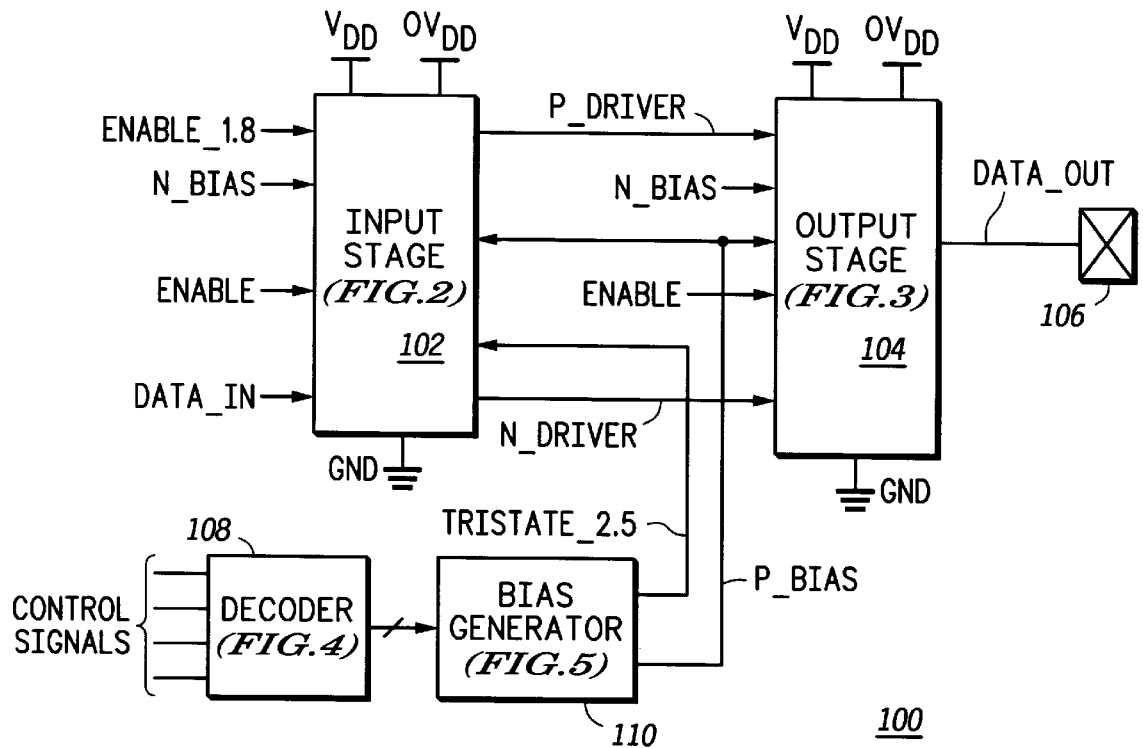
FIG. 1 illustrates a block diagram of an output buffer in accordance with one embodiment of the present invention.

FIG. 1 illustrates a block diagram of an output buffer 100 in accordance with one embodiment of the present invention. Output buffer 100 translates input signals from one voltage range to a second voltage range. Output buffer 100 may advantageously be used at the periphery, or output pad, of a digital circuit. The second voltage range may be identical to the first range or may be greater. The particular range is programmable by one of several means. This feature makes output buffer 100 especially suitable for use in devices which must be compatible with two voltage ranges. Ordinarily, an output buffer must be tolerant of the greater voltage range. If the output buffer was not tolerant of the greater voltage range, then its transistors would not be reliable over the product's lifetime. However, output buffer 100 is manufactured using transistors which need only be tolerant of the first or smaller voltage range. The design of output buffer 100 uses a biasing circuit to limit the voltage across the gate oxide of its various transistors to a level which is consistent with the first voltage range. This limitation allows output buffer 100 to perform correctly over its entire lifetime.

Continuing with FIG. 1, an input stage 102 receives the control signals ENABLE_1.8 and ENABLE, a data input DATA_IN, and three voltage supplies, ground (GND), $V_{DD}$, and $OV_{DD}$. Input stage 102 also receives three biasing voltages TRISTATE_2.5, N_BIAS, and P_BIAS. Input stage 102 generates two control signals P_DRIVER and N_DRIVER. An output stage 104 receives the control signals P_DRIVER and N_DRIVER and three voltage supplies, ground (GND), $V_{DD}$, and $OV_{DD}$. Output stage 104 also receives two biasing voltages N_BIAS and P_BIAS. Output stage 104 generates the data output signal DATA_OUT. DATA_OUT is connected to a pad 106. A decoder 108 processes various control signals before forwarding them to a bias generator 110. Bias generator 110 generates the two biasing voltages, TRISTATE_2.5, and P_BIAS. Input stage 102 is more fully described below in connection with FIG. 2. Output stage 104 is more fully described below in connection with FIG. 3. Decoder 108 is more fully described below in connection with FIG. 4. Bias generator 110 is more fully described below in connection with FIG. 5.

In one embodiment of the present invention, the difference between ground (GND) and $V_{DD}$ is 1.8 Volts. The difference between ground (GND) and $OV_{DD}$ is 1.8, 2.5, or 3.3 Volts. In general, $V_{DD}$ corresponds to the internal voltage level used by circuits (not shown) connected to the input of output buffer 100. Typically, $V_{DD}$ is optimized for the performance of these internal circuits. $V_{DD}$ decreases over time as semiconductor process engineers create faster and smaller transistors. Conversely, $OV_{DD}$ corresponds to the operating voltage of the external interface. Typically, the reduction of this voltage level lags the reduction of the internal voltage level. Therefore it is common for $OV_{DD}$ to be periodically greater than $V_{DD}$. Eventually, $OV_{DD}$ decreases to be equal to $V_{DD}$.

The operation of output buffer 100 may be conveniently described with respect to its various modes of operation: (1) backward compatible mode, (2) high performance mode, and (3) intermediate performance mode. Each of these three modes has a functional submode in which data is output and a tristate submode in which no data is output. In the backward compatible mode of operation, the internal circuits connected to output buffer 100 operate at 1.8 Volts ($V_{DD}$). The external interface ($OV_{DD}$) operates at 3.3 Volts. In the high performance mode, both the internal circuits ($V_{DD}$) and the external interface ($OV_{DD}$) operate at 1.8 Volts. In the intermediate performance mode of operation, the internal circuits connected to output buffer 100 operate at 1.8 Volts ($V_{DD}$) and the external interface ($OV_{DD}$) operates at 2.5 Volts. The particular mode is programmable by the proper combination of logic values on the CONTROL SIGNALS.

Figure 4:
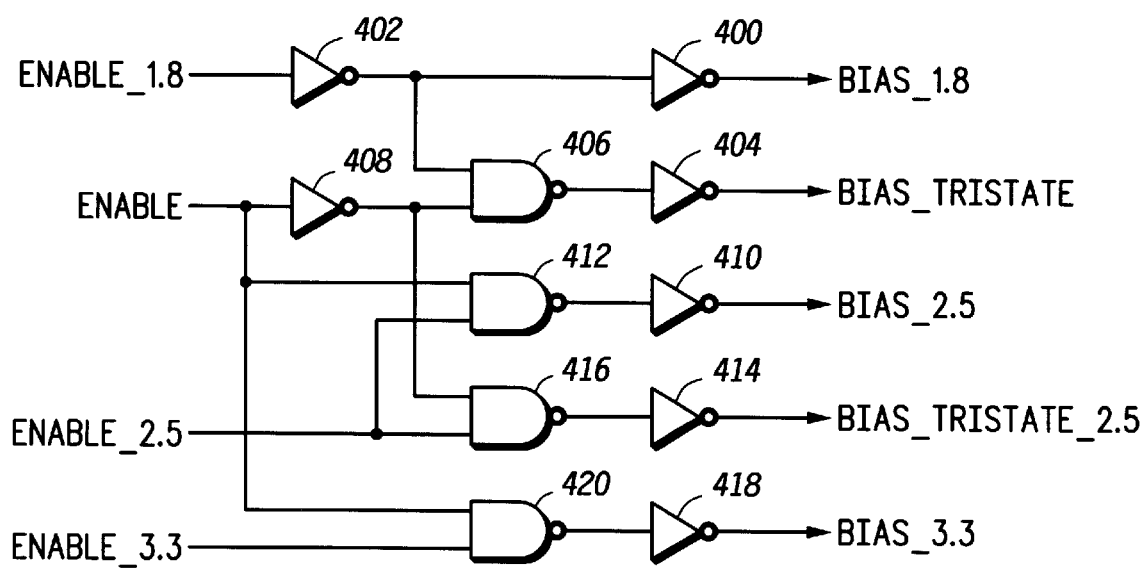
FIG. 4 illustrates a block diagram of the decoder depicted in FIG. 1.

A description of the various signals depicted in FIGS. 1 and 4 will aide in the understanding of the FIG.'s operation:

DATA_IN is a digital logic input which varies from GND to $V_{DD}$. Logic circuits (not depicted) generate this logic signal.

DATA_OUT is a digital logic output which varies from GND to $OV_{DD}$. Output stage 104 generates this logic signal. Logically, DATA_OUT equals DATA_IN.

ENABLE (one of the "CONTROL SIGNALS") is a logic signal. When ENABLE is inactive, output buffer 100 is placed into a high impedance (Z) state. When ENABLE is active, output buffer generates DATA_OUT as described below.

ENABLE_1.8 (one of the "CONTROL SIGNALS") is a logic signal. When ENABLE_1.8 and ENABLE are active, output buffer 100 generates DATA_OUT. DATA_OUT varies from 0 Volts to 1.8 Volts. This signal activates the high performance mode described below. When ENABLE_1.8 is inactive, output buffer 100 is placed into a high impedance (Z) state or operates in another mode.

ENABLE_2.5 (one of the "CONTROL SIGNALS") is a logic signal. When ENABLE_2.5 and ENABLE are active, output buffer 100 generates DATA_OUT. DATA_OUT varies from 0 Volts to 2.5 Volts. This signal activates the intermediate performance mode described below. When ENABLE_2.5 is inactive, output buffer 100 is placed into a high impedance (Z) state or operates in another mode.

ENABLE_3.3 (one of the "CONTROL SIGNALS") is a logic signal. When ENABLE_3.3 and ENABLE are active, output buffer 100 generates DATA_OUT. DATA_OUT varies from 0 Volts to 3.3 Volts. This signal activates the backward compatible mode described below. When ENABLE_3.3 is inactive, output buffer 100 is placed into a high impedance (Z) state or operates in another mode.

GND is a low voltage supply.

N_BIAS is a bias voltage which biases the n-type metal oxide semiconductor field effect transistors (MOSFETs or simply transistors) within input stage 102. In the depicted embodiment, N_BIAS is connected to $V_{DD}$.

N_DRIVER is a logic signal output by input stage 102. N_DRIVER is an active high signal. When N_DRIVER is active, output buffer 100 generates a low logic level on DATA_OUT. When N_DRIVER is inactive, output buffer 100 is either placed into a high impedance (Z) state or outputs a high logic level. The signals ENABLE and P_DRIVER determine whether output buffer 100 is either placed into a high impedance (Z) state or outputs a high logic level. N_DRIVER varies from 0 Volts to 1.8 Volts.

$OV_{DD}$ is a high voltage supply used by the external interface circuits. $OV_{DD}$ may vary depending upon the technology of the external interface.

P_BIAS is a bias voltage which biases the p-type MOSFETs within input stage 102 and output stage 104. Bias generator 110 generates this voltage as described below.

P_DRIVER is a logic signal output by input stage 102. P_DRIVER is an active low signal. When P_DRIVER is active, output buffer 100 generates a high logic level on DATA_OUT. When P_DRIVER is inactive, output buffer 100 is either placed into a high impedance (Z) state or outputs a low logic level. The signals ENABLE and N_DRIVER determine whether output buffer 100 is either placed into a high impedance (Z) state or outputs a low logic level. P_DRIVER varies from 1.7 Volts to 3.3 Volts, from 0 Volts to 1.8 Volts, or from 1.1 Volts to 2.5 Volts, depending upon the mode of operation.

TRISTATE_2.5 is a bias voltage which forces P_DRIVER to $OV_{DD}$ quickly when output buffer 100 is placed into the tristate submode of the intermediate performance mode. Bias generator 110 generates this voltage.

$V_{DD}$ is a high voltage supply used by the circuits (not shown) connected to the input of output buffer 100 and to output buffer 100. In the depicted embodiment, $V_{DD}$ is 1.8 Volts.

The three modes of operation may be selected by a number of techniques. For instance, the enable signals may be connected to the proper voltage levels (ground or $V_{DD}$) at manufacture to select a specific mode. These connections would be accomplished by mounting the integrated circuit into a specially designed package that permanently couples the enable signals of interest to the correct voltage levels. Also, the enable signals of output buffer 100 may be connected to a set of pins that exit the final package. The system designer could select the operating mode by connecting the proper voltage to the pin. Further, output buffer 100 may be connected to a user-visible register. The contents of the register could select a particular mode of operation. In this case, a user could, through software application or operating system (OS) specify the mode by writing a particular value to the register. The selection of a specific mode could be automatic. A circuit which detects the operating voltage of the interface could automatically select the particular mode corresponding to the interface voltage. Excluding the first package option, each of these techniques could be dynamic or static. In a dynamic implementation, the particular mode could be changed over time. In a static implementation, the particular mode would be selected once. Furthermore, the mode could vary depending upon to which external pins its was connected. For instance, in a data processor, certain pins dedicated to a high speed cache could operate in the high performance mode. Conversely, other pins, dedicated to the standard bus interface could operate in the backward compatible mode.

(1) Backward Compatible Mode

In the backward compatible mode of operation, the internal circuits ($V_{DD}$) connected to output buffer 100 operate at 1.8 Volts. In this mode, a signal on the input DATA_IN swings from 0 Volts to 1.8 Volts. The external interface ($OV_{DD}$) operates at 3.3 Volts. A signal on the external interface swings from 0 Volts to 3.3 Volts.

In the functional submode, ENABLE and ENABLE_3.3 are active. Conversely, ENABLE_1.8 and ENABLE_2.5 are inactive. Bias generator 110 generates a first voltage level (1.2 Volts) on P_BIAS which limits the gate-to-source/drain voltages of certain transistors to avoid exceeding their gate dielectric breakdown. If the DATA_IN input is high ($V_{DD}$), then input stage 102 connects P_DRIVER to 1.7 Volts (P_BIAS+Vtp) and connects N_DRIVER to GND. Vtp is the threshold voltage of the p-type MOSFETs. Finally, output stage 104 drives pad 106 to $OV_{DD}$. If the DATA_IN input is low (GND), then input stage 102 connects P_DRIVER to $OV_{DD}$ and connects N_DRIVER to $V_{DD}$. Output stage 104 drives pad 106 to GND. It should be noted that the voltages present on P_DRIVER and N_DRIVER are limited. Specifically, P_DRIVER varies from 3.3 to 1.7 Volts. N_DRIVER varies from GND (0 Volts) to 1.8 Volts. These limitations result in a gate-to-source/drain voltage of no more than 2.1 Volts for the p-type MOSFETs and no more than 1.8 Volts for the n-type MOSFETs.

In the tristate submode, ENABLE is inactive. Bias generator 110 generates a second voltage level (1.8 Volts) on P_BIAS which limits the gate-to-source/drain voltages of certain transistors to avoid exceeding their gate dielectric breakdown. Regardless of the DATA_IN input, input stage 102 connects P_DRIVER to $OV_{DD}$ and connects N_DRIVER to GND. Output stage 104 places pad 106 into a high impedance (Z) state. Here it should be noted that P_DRIVER is limited to 3.3 Volts and N_DRIVER is limited to GND (0 Volts). If the voltage on pad 106 is presumed to vary from GND (0 Volts) to 3.3 Volts, then these limitations result in a gate-to-source/drain voltage of no more than 1.5 Volts for the p-type MOSFETs and no more than a gate-to-source voltage of 1.5 Volts for the n-type MOSFETs.

When output buffer 100 exits the tristate mode, P_BIAS changes from 1.8 Volts to 1.2 Volts.

(2) High Performance Mode

In the high performance mode, both the internal circuits ($V_{DD}$) and the external interface ($OV_{DD}$) operate at 1.8 Volts. In this mode, a signal on the input DATA_IN and a signal on the external interface swing from 0 Volts to 1.8 Volts.

In the functional submode, ENABLE and ENABLE_1.8 are active. Conversely, ENABLE_2.5 and ENABLE_3.3 are inactive. Bias generator 110 generates a third voltage level of 0 Volts on P_BIAS. If the DATA_IN input is high ($V_{DD}$), then input stage 102 connects P_DRIVER to GND (0 Volts) and connects N_DRIVER to GND. Finally, output stage 104 drives pad 106 to $OV_{DD}$ (which equals $V_{DD}$). If the DATA_IN input is low (GND), then input stage 102 connects P_DRIVER to $OV_{DD}$ (which equals $V_{DD}$) and connects N_DRIVER to $V_{DD}$. Output stage 104 drives pad 106 to GND. In this mode, the voltages present on P_DRIVER and N_DRIVER do not exceed a 1.8 Volt swing.

In the tristate submode, ENABLE is inactive. Bias generator 110 generates the third voltage level (0 Volts) on P_BIAS which limits the gate-to-source/drain voltages of certain transistors to avoid exceeding their gate dielectric breakdown. Regardless of the DATA_IN input, input stage 102 connects P_DRIVER to $OV_{DD}$ (which equals $V_{DD}$) and connects N_DRIVER to GND. Output stage 104 places pad 106 into a high impedance (Z) state. Here it should be noted that P_DRIVER is limited to 1.8 Volts and N_DRIVER is limited to GND (0 Volts). If the voltage on pad 106 is presumed to vary from GND (0 Volts) to 1.8 Volts, then these limitations result in a gate-to-source/drain voltage of no more than 1.8 Volts for the p-type MOSFETs and no more than 1.8 Volts for the n-type MOSFETs.

(3) Intermediate Performance Mode

In the intermediate performance mode, the internal circuits ($V_{DD}$) connected to output buffer 100 operate at 1.8 Volts. In this mode, a signal on the input DATA_IN swings from 0 Volts to 1.8 Volts. The external interface ($OV_{DD}$) operates at 2.5 Volts. A signal on the external interface swings from 0 Volts at 2.5 Volts.

In the functional submode, and ENABLE_2.5 are active. Conversely, ENABLE_1.8 and ENABLE_3.3 are inactive. Bias generator 110 generates a fourth voltage level (0.6 Volts) on P_BIAS which limits the gate-to-source/drain voltages of certain transistors to avoid exceeding their gate dielectric breakdown. If the DATA_IN input is high ($V_{DD}$), then input stage 102 connects P_DRIVER to 1.1 Volts (P_BIAS+Vtp) and connects N_DRIVER to GND. Finally, output stage 104 drives pad 106 to $OV_{DD}$. If the DATA_IN input is low (GND), then input stage 102 connects P_DRIVER to $OV_{DD}$ and connects N_DRIVER to $V_{DD}$. Output stage 104 drives pad 106 to GND. It should be noted that the voltages present on P_DRIVER and N_DRIVER are limited. Specifically, P_DRIVER varies from 2.5 to 1.1 Volts. N_DRIVER varies from GND (0 Volts) to 1.8 Volts. These limitations result in a gate-to-source/drain voltage of no more than 1.9 Volts for the p-type MOSFETs and no more than 1.8 Volts for the n-type MOSFETs.

In the tristate submode, ENABLE is inactive. Bias generator 110 generates the second voltage level (1.8 Volts) on P_BIAS which limits the gate-to-source/drain voltages of certain transistors to avoid exceeding their gate dielectric breakdown. TRISTATE_2.5 is also active. TRISTATE_12.5 generates a voltage level equal to (GND+Vtp) or about 0.5 Volts. Regardless of the DATA_IN input, input stage 102 connects P_DRIVER to $OV_{DD}$ and connects N_DRIVER to GND. Output stage 104 places pad 106 into a high impedance (Z) state. Here it should be noted that P_DRIVER is limited to 2.5 Volts and N_DRIVER is limited to GND (0 Volts). If the voltage on pad 106 is presumed to vary from GND (0 Volts) to 2.5 Volts, then these limitations result in a gate-to-source/drain voltage of no more than 2.0 Volts for the p-type MOSFETs and no more than 1.8 Volts for the n-type MOSFETs.

When output buffer 100 exits the tristate mode, BIAS_TRISTATE_2.5 changes from 0.5 Volts to $V_{DD}$ (1.8 Volts). At the same time, P_BIAS changes from 1.8 Volts to 0.6 Volts.

In the depicted embodiment, P_BIAS is connected to both input stage 102 and to output stage 104. In other embodiments, two bias generators can be separately connected to input stage 102 and to output stage 104. Also, the signals labeled N_BIAS are connected to $V_{DD}$. In other embodiments, one or more bias generators can generate these signals. One skilled in the art, in conjunction with the instant description, may adjust the number and independence of bias generators to suit the particular constraints of an application.

Figure 2:
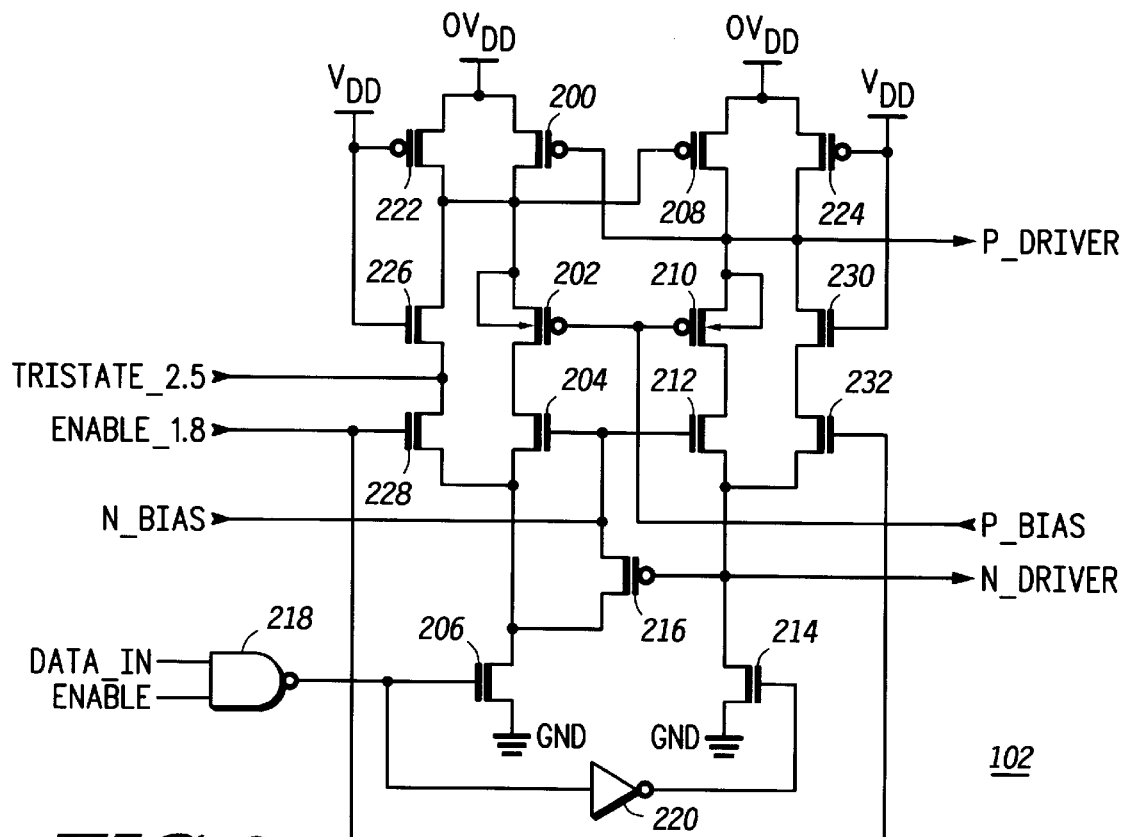
FIG. 2 illustrates a schematic diagram of the input stage depicted in FIG. 1.

FIG. 2 illustrates a schematic diagram of input stage 102 depicted in FIG. 1. Four transistors 200, 202, 204, and 206 are connected in series between $OV_{DD}$ and GND. Specifically, a first current electrode of p-type MOSFET 200 receives the voltage supply $OV_{DD}$. A second current electrode of transistor 200 is connected to a first current electrode of p-type MOSFET 202. A second current electrode of transistor 202 is connected to a first current electrode of n-type MOSFET 204. A control electrode of transistor 202 receives the voltage P_BIAS. The first current electrode of transistor 202 is also connected to its body. A second current electrode of transistor 204 is connected to a first current electrode of n-type MOSFET 206. A control electrode of transistor 204 receives the bias voltage N_BIAS. A second current electrode of a transistor 206 receives the voltage supply GND.

Four transistors 208, 210, 212, and 214 are also connected in series between $OV_{DD}$ and GND. Specifically, a first current electrode of p-type MOSFET 208 receives the voltage supply $OV_{DD}$. A second current electrode of transistor 208 is connected to a first current electrode of p-type MOSFET 210. The second current electrode of a transistor 208 generates the signal P_DRIVER. A control electrode of transistor 208 is connected to the second current electrode of transistor 200. A second current electrode of transistor 210 is connected to a first current electrode of n-type MOSFET 212. A control electrode of transistor 210 is connected to a control electrode of transistor 202, thereby receiving the voltage P_BIAS. The first current electrode of transistor 210 is also connected to its body. A second current electrode of transistor 212 is connected to a first current electrode of n-type MOSFET 214. The second current electrode of transistor 212 generates the signal N_DRIVER. A control electrode of transistor 212 is connected to a control electrode of transistor 204. A second current electrode of a transistor 214 receives the voltage supply GND.

A first current electrode of a p-type MOSFET 216 is connected to the control electrodes of transistors 204 and 212. A second current electrode of transistor 216 is connected to the first current electrode of transistor 206. A control electrode of transistor 216 is connected to a second current electrode of transistor 212. A first input of a NAND gate 218 receives the data input DATA_IN. A second input of the NAND gate 218 receives the control signal ENABLE. An output of NAND gate 218 is connected to a control electrode of transistor 206 and to an input of an inverter 220. An output of inverter 220 is connected to a control electrode of a transistor 214.

A first current electrode of p-type MOSFET 222 receives the voltage supply $OV_{DD}$. A second current electrode of transistor 222 is connected to a second current electrode of transistor 200. A control electrode of a transistor 222 receives the voltage supply $V_{DD}$. A first current electrode of p-type MOSFET 224 receives the voltage supply $OV_{DD}$. A second current electrode of transistor 224 is connected to a second current electrode of transistor 208. A control electrode of a transistor 224 receives the voltage supply $V_{DD}$.

Two transistors 226 and 228 form a by-pass path around transistors 202 and 204. Specifically, a first current electrode of n-type MOSFET 226 is connected to the first current electrode of transistor 202. A second current electrode of transistor 226 is connected to a first current electrode of n-type MOSFET 228. The second current electrode of transistor 226 also receives the bias voltage TRISTATE_2.5. A second current electrode of transistor 228 is connected to a second current electrode of transistor 204. A control electrode of transistor 226 is connected to the voltage level $V_{DD}$. A control electrode of transistor 228 receives the control signal ENABLE_1.8. Similarly, two transistors 230 and 232 form a by-pass path around transistors 210 and 212. Specifically, a first current electrode of n-type MOSFET 230 is connected to the first current electrode of transistor 210. A second current electrode of transistor 230 is connected to a first current electrode of n-type MOSFET 232. A second current electrode of transistor 232 is connected to a second current electrode of transistor 212. A control electrode of transistor 230 is connected to the voltage level $V_{DD}$. A control electrode of transistor 232 receives the control signal ENABLE_1.8.

In operation, transistors 200, 206, 208, and 214 form a voltage translating circuit. When enabled by an active logic level on the signal ENABLE, NAND gate 218 inverts the input DATA_IN a first time. Transistors 200 and 206 invert the input a second time. Finally, transistors 208 and 214 invert the input a third time. The outputs P_DRIVER and N_DRIVER are the logical complement of the input DATA_IN. The outputs P_DRIVER and N_DRIVER output different voltage levels though these voltage levels correspond to the same logic level. Furthermore, these voltage levels differ in magnitude from the internal voltage supply, GND and $V_{DD}$. When disabled by an inactive logic level on the signal ENABLE, the outputs P_DRIVER and N_DRIVER correspond to a high logic level.

Transistors 202, 204, 210, and 212 form a voltage limiting circuit. This voltage limiting circuit ensures that the gate-to-source/drain voltages present on the transistors in input stage 102 do not exceed their gate dielectric breakdown voltage. As described below, input stage 102 also protects output stage 104. In the depicted embodiment, the gate dielectric breakdown voltage is 2.4 Volts. In general, the n-type MOSFETs 204 and 212 protect transistors 206 and 214 from an excessive drain-to-gate voltage. Similarly, the p-type MOSFETs 202 and 210 protect transistors 200 and 208 from an excessive drain-to-gate voltage.

When DATA_IN is low, transistors 206 and 204 are in a conducting state. Therefore, the first current electrode of transistor 204 is coupled to GND. Transistor 202 limits the voltage on the second current electrode of transistor 200 to a value equal to (GND+P_BIAS+Vtp). This voltage level places transistor 208 into a conducting state, pulling P_DRIVER to $OV_{DD}$. Transistor 210 is also conducting, passing the voltage level $OV_{DD}$ to the first current electrode of transistor 212. Transistor 212 limits the voltage on N_DRIVER to (N_BIAS–Vtn). $V_{tn}$ is the threshold voltage for an n-type MOSFET.

Conversely, when DATA_IN is high, transistors 214 and 212 are in a conducting state. Therefore, the first current electrode of transistor 212 is coupled to GND. Transistor 210 limits the voltage on P_DRIVER to a value equal to (P_BIAS+Vtp). This voltage level places transistor 200 into a conducting state, pulling the first current electrode of transistor 202 to $OV_{DD}$. Transistor 202 is also conducting, passing the voltage level $OV_{DD}$ to the first current electrode of transistor 204. Transistor 204 limits the voltage on the first current electrode of transistor 206 to (N_BIAS–Vtn). However, transistor 216 pulls the first current electrode of transistor 206 to N_BIAS. Transistor 216 ensures that the first current electrode of transistor 206 does not rise above N_BIAS.

When output buffer 100 is not enabled, it operates as described above when DATA_IN corresponds to a low logic level.

Transistors 226, 228, 230, and 232 form a bypass path around the voltage limiting circuit. In the high performance mode, both $V_{DD}$ and $OV_{DD}$ are 1.8 Volts. In this case, there is no need to translate the input voltage to another domain, nor is there a need to protect the various gate dieletrics. Consequently, the second current electrodes of both of transistors 200 and 208 are connected directly to the first current electrodes of transistor 206 and 214, respectively. This path allows P_DRIVER to fully swing from GND and $OV_{DD}$. This swing improves the performance of output buffer 100.

Transistors 222 and 224 are weak transistors. These transistors provide trickle currents to the two nodes formed by the second current electrodes of transistors 200 and 208. Transistors 222 and 224 supply current lost by transistors 202 and 210, ensuring that the first current electrodes of transistors 202 and 210 do not fall below (P_BIAS+$V_{tp}$).

BIAS_TRISTATE_2.5 is a low voltage level which forces transistor 208 into a conducting state quickly when enabled. Transistor 208 will drive P_DRIVER to $OV_{DD}$ quickly as output buffer 100 is placed into the high impedance (Z) state while in the intermediate performance mode.

Figure 3:
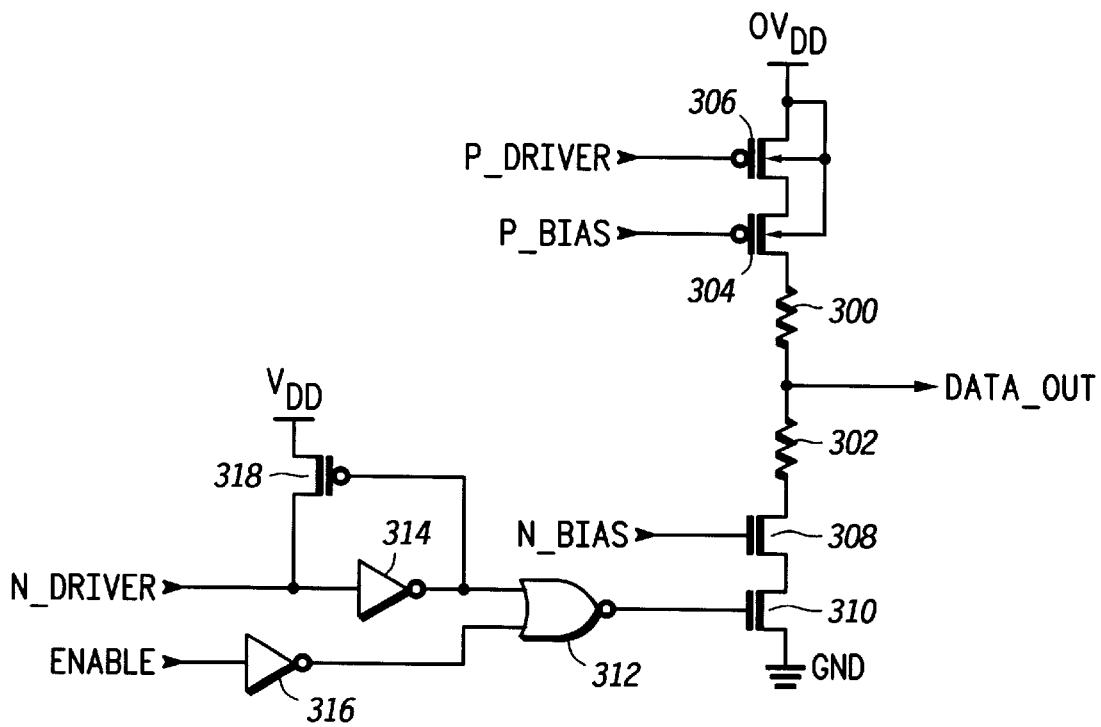
FIG. 3 illustrates a schematic diagram of the output stage depicted in FIG. 1.

FIG. 3 illustrates a schematic diagram of output stage 104 depicted in FIG. 1. A first terminal of a resistor 300 and a first terminal of a resistor 302 are connected together to generate the output DATA_OUT. A second terminal of resistor 300 is connected to a first current electrode of a p-type MOSFET 304. A second current electrode of transistor 304 is connected to a first current electrode of a p-type MOSFET 306. A control electrode of transistor 304 receives the bias voltage P_BIAS. A second current electrode of transistor 306 receives the supply voltage $OV_{DD}$. A control electrode of transistor 306 receives the control signal P_DRIVER. The supply voltage $OV_{DD}$ is also connected to the body of both of transistors 304 and 306. A second terminal of resistor 302 is connected to a first current electrode of an n-type MOSFET 308. A second current electrode of transistor 308 is connected to a first current electrode of an n-type MOSFET 310. A control electrode of transistor 308 receives the bias voltage N_BIAS. A second current electrode of transistor 310 receives the voltage supply GND. A control electrode of transistor 310 is connected to an output of a NOR gate 312. A first input of NOR gate 312 is connected to an output of an inverter 314. A second input of NOR gate 312 is connected to an output of an inverter 316. An input of inverter 314 receives the control signal N_DRIVER. The input to inverter 314 is also connected to a first current electrode of a p-type MOSFET 318. A second current electrode of transistor 318 receives the voltage supply $V_{DD}$. A control electrode of transistor 318 is connected to the output of inverter 314. An input of inverter 316 receives the control signal ENABLE.

In operation, output stage 104 is a tristateable inverter. If ENABLE is active, then transistors 306 and 310 buffer the input DATA_IN. Specifically, if DATA_IN is a low logic level, then P_DRIVER and N_DRIVER are both logic high values. A high logic value places transistor 306 into a non-conducting state and places transistor 310 into a conducting state. Transistor 310 pulls the node formed by the first terminal of resistors 300 and 302 to GND. If DATA_IN is a high logic level, then P_DRIVER and N_DRIVER are both logic low values. A low logic value places transistor 306 into a conducting state and places transistor 310 into a non-conducting state. Transistor 306 pulls the node formed by the first terminal of resistors 300 and 302 to $OV_{DD}$. If ENABLE is inactive, then input stage 102 drives P_DRIVER to a high logic level, placing transistor 306 into a non-conducting state. An inactive ENABLE signal forces NOR gate 312 to generate a low logic level, also placing transistor 310 into a non-conducting state. In this "tristate," the node formed by the first terminal of resistors 300 and 302 is not driven to any voltage level.

Transistors 304 and 308 ensure that the gate-to-source/drain voltages present on the transistors in output stage 104 do not exceed their gate dielectric breakdown voltage. In general, the p-type MOSFET 304 protects transistor 306 from an excessive drain-to-gate voltage. Similarly, the n-type MOSFET 308 protects transistor 310 from an excessive drain-to-gate voltage.

When DATA_IN is low, transistors 304 and 306 are non-conducting. Conversely, transistors 308 and 310 are conducting. Therefore, transistor 310 pulls the node formed by the first terminal of resistors 300 and 302 to GND. The node formed by the connection of transistors 304 and 306 is at a voltage level equal to (P_BIAS+$V_{tp}$). Conversely, the node formed by the connection of transistors 308 and 310 is at a voltage level equal to GND. The gate-to-source voltage of transistor 306 is (P_DRIVER–$OV_{DD}$) or ($OV_{DD}$–$OV_{DD}$) or 0 Volts. The gate-to-source voltage of transistor 304 is (P_BIAS–(P_BIAS+$V_{tp}$)) or simply (–$V_{tp}$). The gate-to-source voltage of transistor 310 is ($V_{DD}$–GND) or simply $V_{DD}$. The gate-to-source voltage of transistor 308 is (N_BIAS–GND) or ($V_{DD}$–GND) or simply $V_{DD}$.

When DATA_IN is high, transistors 304 and 306 are conducting. Conversely, transistors 310 and 308 are non-conducting. Therefore, transistor 306 pulls the node formed by the first terminal of resistors 300 and 302 to $OV_{DD}$. The node formed by the connection of transistors 304 and 306 is at a voltage level equal to $OV_{DD}$. Conversely, the node formed by the connection of transistors 308 and 310 is at a voltage level equal to (N_BIAS–$V_{tn}$) or ($V_{DD}$–$V_{tn}$). The gate-to-source voltage of transistor 306 is (P_DRIVER–$OV_{DD}$) or ((P_BIAS+$V_{tp}$)–$OV_{DD}$). The gate-to-source voltage of transistor 304 is (P_BIAS–$OV_{DD}$). The gate-to-source voltage of transistor 310 is (GND–GND) or simply 0 Volts. The gate-to-source voltage of transistor 308 is (N_BIAS–($V_{DD}$–$V_{tn}$)) or ($V_{DD}$–($V_{DD}$–$V_{tn}$)) or simply $V_{tn}$. Transistor 318 ensures that N_DRIVER does not rise above N_BIAS.

Series-connected resistors 300 and 302 serve two purposes. First, resistors 300 and 302 allow the output impedance of output buffer 100 to match the input impedance of a device connected to pad 106. Second, resistors 300 and 302 minimize the current that flows through transistors 304, 306, 308, and 310 when these transistors are all on. This current is often called "crowbar" current. Crowbar current occurs when output stage 104 switches from one state to the other state and transistors 306 and 310 are both on momentarily.

FIG. 4 illustrates a block diagram of decoder 108 depicted in FIG. 1. An output of an inverter 400 generates the control signal BIAS_1.8. An input of inverter 400 is connected to an output of an inverter 402. An input of inverter 402 receives the control signal ENABLE_1.8. An output of an inverter 404 generates the control signal BIAS_TRISTATE. An input of inverter 404 is connected to an output of a NAND gate 406. A first input of NAND gate 406 is connected to the output of inverter 402. A second input of NAND gate 406 is connected to an output of an inverter 408.

An input of inverter 408 receives the control signal ENABLE. An output of an inverter 410 generates the control signal BIAS_2.5. An input of inverter 410 is connected to an output of a NAND gate 412. A first input of NAND gate 412 receives the control signal ENABLE. A second input of NAND gate 412 receives the control signal ENABLE_2.5. An output of an inverter 414 generates the control signal BIAS_TRISTATE_2.5. An input of inverter 414 is connected to an output of a NAND gate 416. A first input of NAND gate 416 is connected to the output of inverter 408. A second input of NAND gate 416 receives the control signal ENABLE_2.5. An output of an inverter 418 generates the control signal BIAS_3.3. An input of inverter 418 is connected to an output of a NAND gate 420. A first input of NAND gate 420 receives the control signal ENABLE. A second input of NAND gate 420 receives the control signal ENABLE_3.3.

Figure 5:
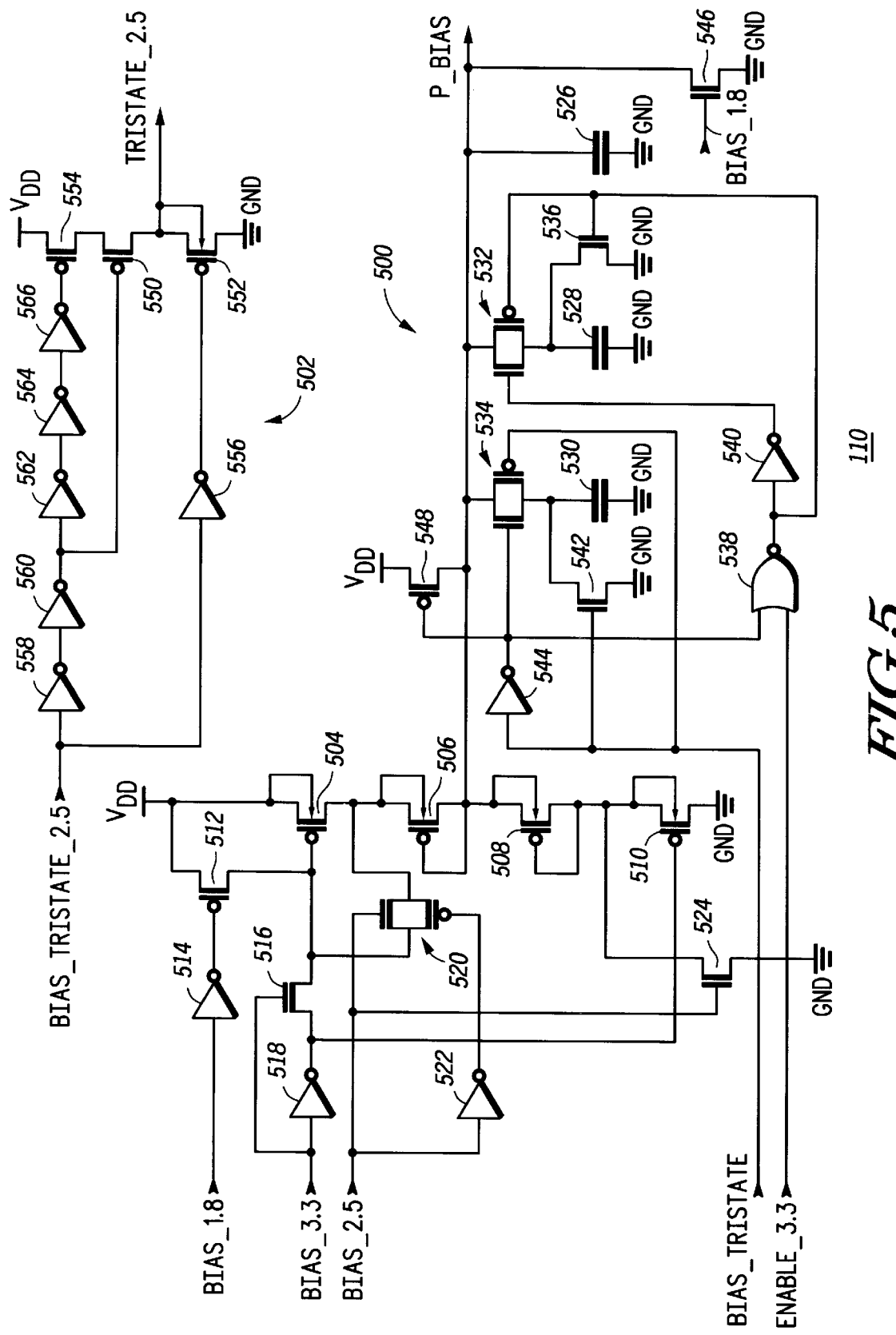
FIG. 5 illustrates a schematic diagram of the bias generator depicted in FIG. 1.

FIG. 5 illustrates a schematic diagram of bias generator 110 depicted in FIG. 1. Bias generator 110 consists of a first portion 500 and a second portion 502. First portion 500 generates the bias voltage P_BIAS. Second portion 502 generates the bias voltage TRISTATE_2.5.

Continuing with first portion 500, four p-type MOSFETs 504, 506, 508, and 510 are connected in series between the voltage supply $V_{DD}$ and the voltage supply GND. Specifically, a first current electrode of transistor 504 receives the voltage supply $V_{DD}$. A second current electrode of transistor 504 is connected to a first current electrode of a transistor 506. A second current electrode of transistor 506 is connected to the control electrode thereof and to a first current electrode of transistor 508. The second current electrode of transistor 506 generates the bias voltage P_BIAS. A second current electrode of transistor 508 is connected to the control electrode thereof and to a first current electrode of transistor 510. A second current electrode of transistor 510 receives the voltage supply GND. The first current electrode of each of transistors 504, 506, 508, and 510 are connected to their respective bodies.

A first current electrode of a p-type MOSFET 512 receives the voltage supply $V_{DD}$. A second current electrode of transistor 512 is connected to a control electrode of transistor 504. A control electrode of transistor 512 is connected to an output of an inverter 514. An input of inverter 514 receives the control signal BIAS_1.8. The control electrode of transistor 504 is also connected to a first current electrode of an n-type MOSFET 516. A second current electrode of transistor 516 is connected to an output of an inverter 518. A control electrode of transistor 516 and an input of inverter 518 receive the control signal BIAS_3.3. A first terminal of a pass gate 520 is connected to the first current electrode of transistor 516. A second terminal of pass gate 520 is connected to the second current electrode of transistor 504. A control electrode of the n-type MOSFET in pass gate 520 receives the control signal BIAS_2.5. A control electrode of a p-type MOSFET in pass gate 520 is connected to an output of an inverter 522. An input of inverter 522 receives the control signal BIAS_2.5. A first current electrode of an n-type MOSFET 524 is connected to the second current electrode of transistor 508. A second current electrode of transistor 524 receives the voltage supply GND. A control electrode of transistor 524 is connected to the output of inverter 518.

Three capacitors 526, 528, and 530 are connected between the output of first portion 500 and the voltage supply GND. Capacitor 526 is connected directly to the second current electrode of transistor 506. Capacitors 528 and 530 are connected to the second current electrode of transistor 506 individually through two pass gates 532 and 534. Specifically, a first terminal of capacitor 526 is connected to the second current electrode of transistor 506. A second terminal of capacitor 526 receives the voltage supply GND. A first terminal of capacitor 528 is connected to a first terminal of pass gate 532. A second terminal of capacitor 528 receives the voltage supply GND. A second terminal of pass gate 532 is connected to the second current electrode of transistor 506. A first terminal of capacitor 530 is connected to a first terminal of pass gate 534. A second terminal of capacitor 530 receives the voltage supply GND. A second terminal of pass gate 534 is connected to the second current electrode of transistor 506.

An n-type MOSFET 536 is connected in parallel to capacitor 528. A first current electrode of transistor 536 is connected to the first terminal of capacitor 528. A second current electrode of transistor 536 receives the voltage supply GND. A control electrode of transistor 536 is connected to an output of a NOR gate 538. An output of NOR gate 538 is also connected to a p-type device in pass gate 532 and to an input of an inverter 540. An output of inverter 540 is connected to an n-type device in pass gate 532.

An n-type MOSFET 542 is connected in parallel to capacitor 530. A first current electrode of transistor 542 is connected to the first terminal of capacitor 530. A second current electrode of transistor 542 receives the voltage supply GND. A control electrode of transistor 542 receives the control signal BIAS_TRISTATE. The control signal BIAS_TRISTATE is also connected to a p-type device in pass gate 534. An output of an inverter 544 is connected to an n-type device in pass gate 534. An input of inverter 544 receives the control signal BIAS_TRISTATE.

An n-type MOSFET 546 and a p-type MOSFET 548 are also connected to the output of first portion 500. A first current electrode of transistor 546 is connected to the second current electrode of transistor 506. A second current electrode of transistor 546 receives the voltage supply GND. A control electrode of transistor 546 receives the control signal BIAS_1.8. A first current electrode of transistor 548 is connected to the second current electrode of transistor 506. A second current electrode of transistor 548 receives the voltage supply $V_{DD}$. A control electrode of transistor 548 is connected to the output of inverter 544.

In operation, the four transistors 504, 506, 508, and 510 generate one of two voltage levels at the output of first portion 500; $\frac{2}{3}*V_{DD}$ or $\frac{1}{3}*V_{DD}$. The two transistors 546 and 548 generate one of two voltage levels at the output of first portion 500; $V_{DD}$ or GND. Each of the control signals input to first portion 500 is mutually exclusive of the other.

When disabled or placed into the tristate submode of operation, the control signal BIAS_TRISTATE is active and all other control signals are inactive. BIAS_TRISTATE places transistor 548 into a conducting state, pulling the output of first portion 500 to the voltage supply $V_{DD}$.

In the backward compatible mode, P_BIAS equals $\frac{2}{3}*V_{DD}$ or 1.2 Volts. In this case, the control signal BIAS_3.3 is active and couples a low logic level to the control electrode of transistor 504. A low logic level on transistor 504 places it into a conducting state. Transistors 506, 508, and 510 thereby form three diode-connected transistors. In this configuration, the output of first portion 500 is effectively taken from between the first "diode," transistor 506, and the second "diode," transistor 508.

In the high performance mode, P_BIAS equals GND or 0 Volts. In this case, the control signal BIAS_1.8 is active, connecting the voltage supply $V_{DD}$ to the control electrode of transistor 504. A high value on the control electrode of transistor 504 places it into a non-conducting state. The second current electrode of transistor 506 will float once any one of the series-connected transistors is in a non-conducting state. However, the control signal BIAS_1.8 will also place transistor 546 into a conducting state, pulling the output of first portion 500 to the voltage level GND.

In the intermediate performance mode, P_BIAS equals $\frac{1}{3}*V_{DD}$ or 0.6 Volts. In this case, the control signal BIAS_2.5 is active and couples the control electrode of transistor 504 to the second current electrode thereof via pass gate 520. Transistor 504 is thereby configured as a diode. The control signal BIAS_2.5 also connects the second current electrode of transistor 508 directly to the voltage supply GND. Transistor 510 does not take part in the operation of first portion 500. Transistors 504, 506, and 508 thereby form three diode-connected transistors. In this configuration, the output of first portion 500 is taken from between the second "diode," transistor 506, and the third "diode," transistor 508.

Capacitors 526, 528, and 530 form a charge redistribution circuit. The capacitance of capacitor 526 helps isolate the voltage output by first portion 500 from any noise which may be in or near output buffer 100. Capacitors 528 and 530 reduce the required size of transistors 504, 506, 508, and 510. When first portion 500 exits the tristate, one or both of capacitors 528 and 530 are connected to the output through their corresponding pass gate. The selected capacitor(s) can then share or redistribute the charge previously stored on capacitor 526 alone. This charge redistribution methodology allows first portion 500 to operate at higher speeds and lower power than would be normally achievable with a given size of transistors 504, 506, 508, and 510.

In the high performance mode, capacitors 528 and 530 are always connected to the output of first portion 500. In the backward compatible mode of operation, capacitors 526 and 528 are initially connected to the output. When output buffer 100 exits the tristate submode, all three capacitors are connected to the output. The voltage output by first portion 500 is a function of the voltage and relative capacitances:

$$P\_BIAS = V_{DD} * \left( \frac{C_{526} + C_{528}}{C_{526} + C_{528} + C_{530}} \right)$$

where the C is the capacitance of the referenced element. In the depicted embodiment, the three capacitances are equal. Therefore, P_BIAS equals $V_{DD}*(\frac{2}{3})$ or 1.2 Volts. In the intermediate performance mode of operation, only capacitors 526 is initially connected to the output. When output buffer 100 exits the tristate submode, again all three capacitors are connected to the output. The voltage output by first portion 500 is a function of the voltage and relative capacitances:

$$P\_BIAS = V_{DD} * \left( \frac{C_{526}}{C_{526} + C_{528} + C_{530}} \right).$$

In the depicted embodiment, the three capacitances are equal. Therefore, P_BIAS equals $V_{DD}*(\frac{1}{3})$ or 0.6 Volts. In the backward compatible and intermediate performance modes, transistors 536 and 542 discharge their associated capacitors when the capacitors are not connected to the output.

Continuing with the second portion 502, a first current electrode of a p-type MOSFET 550 and a first current electrode of a p-type MOSFET 552 are connected together to generate the bias voltage TRISTATE_2.5. A second current electrode of transistor 550 is connected to a first current electrode of a p-type MOSFET 554. A second current electrode of transistor 554 receives the voltage supply $V_{DD}$. A second current electrode of transistor 552 receives the voltage supply GND. A control electrode of transistor 552 is connected to an output of an inverter 556. An input of inverter 556 receives the control signal BIAS_TRISTATE_2.5. Five additional inverters 558, 560, 562, 564, and 566 are connected in series, input to output. An output of inverter 566 is connected to a control electrode of transistor 554. An output of inverter 560 is connected to a control electrode of transistor 550.

In operation, second portion 502 itself is tristated when output buffer 100 is enabled. Specifically, neither transistors 552 or 554 are in a conducting state. When output buffer 100 is disabled and enters the tristate mode from the intermediate performance mode, second portion 502 outputs a bias voltage equal to ($V_{tp}$+GND) by placing transistor 552 into a conducting state. Transistor 550 is placed into a non-conducting state prior to transistor 554 becoming conductive. This order of events ensures that crowbar current does not flow through transistors 550, 552, and 554. Second portion 502 generates a pulse when output buffer 100 exits the tristate submode to the intermediate performance mode. Initially, transistor 552 is placed into a non-conductive state. Next, transistor 550 is placed into a conductive state. Note, transistor 554 is already in a conductive state. Second portion 502 then drives the output TRISTATE_2.5 to the voltage supply $V_{DD}$. Three gate delay lengths later, transistor 554 turns off, tristating the output of second portion 502.

Those skilled in the art will recognize that modifications and variations can be made without departing from the spirit of the invention. For instance, the p-type MOSFETs and n-type MOSFETs in the voltage limiting circuit depicted in FIG. 2 may be reversed. Also, in the depicted embodiment, N_BIAS is connected to the $V_{DD}$. In other embodiments, N_BIAS may be programmed as is P_BIAS. Similarly, each transistor in the voltage limiting circuit and/or both of transistors 304 and 308 may be separately programmed. Therefore, it is intended that this invention encompass all such variations and modifications as fall within the scope of the appended claims.

We claim:

1. A method for buffering an input signal having a first voltage in a circuit to an output signal having a second voltage, comprising the steps of:

implementing the circuit as a voltage translation circuit having transistors with a predetermined gate dielectric breakdown voltage and for use with first and second supply voltages, the first supply voltage not exceeding the predetermined gate dielectric breakdown voltage limit and the second supply voltage exceeding the predetermined gate dielectric breakdown voltage limit;

receiving the input signal at an input terminal of the circuit, the first voltage of the input signal being equal to the first supply voltage;

programmably selecting with control circuitry at least one bias voltage from a plurality of bias voltage values, the at least one bias voltage having a magnitude which is appropriate for use with the second supply voltage, the magnitude of the at least one bias voltage being chosen so that the predetermined gate dielectric breakdown voltage is not exceeded anywhere in the circuit, the control circuitry being able to change the at least one bias voltage to another value among the plurality of bias voltage values in response to a user of the circuit selecting another voltage magnitude for the second supply voltage; and selectively providing the output signal at an output terminal, the output signal being substantially equal to the second supply voltage.

2. The method of claim 1 wherein the step of programmably selecting with control circuitry the at least one bias voltage further comprises the step of a user selecting the at least one bias voltage by software control or by providing a control voltage to an integrated circuit pin of an integrated circuit containing the circuit.

3. The method of claim 1 wherein the step of programmably selecting with control circuitry the at least one bias voltage further comprises implementing the circuit in an integrated circuit having a package design so that an internal package pin is driven to a control voltage indicating the magnitude of the second supply voltage.

4. The method of claim 1 wherein the step of programmably selecting with control circuitry the at least one bias voltage further comprises the step of detecting a predetermined condition external to the circuit to determine which one of the plurality of bias voltage values is selected.

5. An output buffer comprising:
 a voltage level translator for operation with two supply voltages referenced to a reference voltage, a first supply voltage having a magnitude which is below a maximum gate dielectric breakdown voltage value of transistors in the voltage level translator, and a second supply voltage having a magnitude which is above the maximum gate dielectric breakdown voltage value, the voltage level translator receiving an input signal which is less than or equal to the first supply voltage and providing an output signal which is less than or equal to the second supply voltage;
 a decoder for receiving at least one control input value and providing a bias voltage select signal which selects at least one bias voltage for use with the voltage level translator; and
 a bias voltage generator coupled to the decoder and to the voltage level translator, the bias voltage generator providing to the voltage level translator the at least one bias voltage which has one of a plurality of predetermined differing values which are determined by the at least one control input value, the at least one bias voltage having a voltage magnitude which guarantees that the maximum gate dielectric breakdown voltage value is not exceeded anywhere in the voltage level translator for a known maximum second supply voltage value.

6. The output buffer of claim 5 wherein the voltage level translator further comprises:
 an input stage having an input terminal for receiving the input signal, the input stage providing pre-drive signals for transistors of a first and a second conductivity type, the pre-drive signals for transistors of the first conductivity type varying in voltage between a first pre-drive voltage and the second supply voltage, the pre-drive signals for transistors of the second conductivity type varying in voltage between a second pre-drive voltage and the reference voltage; and
 an output stage coupled to the input stage, the output stage being driven by the pre-drive signals with voltage levels which do not exceed the maximum gate dielectric breakdown voltage value, the output stage providing the output signal.

7. The output buffer of claim 6 wherein the input stage further comprises:
 a first transistor of the first conductivity type having a first current electrode for receiving the second supply voltage, a control electrode, and a second current electrode;
 a second transistor of the first conductivity type having a first current electrode for receiving the second supply voltage, a control electrode coupled to the second current electrode of the first transistor, and a second current electrode coupled to the control electrode of the first transistor for providing a first of the pre-drive signals;
 a voltage limiting circuit coupled to the second current electrodes of the first and second transistors, the voltage limiting circuit limiting a first one of the pre-drive signals to a voltage swing between the second supply voltage and a first predetermined intermediate voltage between the reference voltage and the second supply voltage which prevents gate dielectric breakdown voltage in the input and output stages from being reached, the voltage limiting circuit limiting a second one of the pre-drive signals to a voltage swing between a second predetermined intermediate voltage between the reference voltage and the second supply voltage which prevents gate dielectric breakdown voltage in the input and output stages from being reached, the voltage limiting circuit receiving the at least one bias voltage from the bias voltage generator;
 a third transistor of the second conductivity type having a first current electrode coupled to the voltage limiting circuit, a control electrode for receiving the input signal, and a second current electrode coupled to the reference voltage; and
 a fourth transistor of the second conductivity type having a first current electrode coupled to the voltage limiting circuit for providing a second of the pre-drive signals, a control electrode for receiving an inverse of the input signal, and a second current electrode coupled to the reference voltage.

8. The output buffer of claim 7 wherein the voltage limiting circuit further comprises:
 fifth, sixth, seventh and eighth transistors wherein the fifth and sixth transistors are coupled in series between the first and third transistors, the seventh and eighth transistors being coupled in series between the second and fourth transistors, the fifth and seventh transistor are biased by a first of the at least one bias voltage and the sixth and eighth transistor are biased by a second of the at least one bias voltage, the fifth and sixth transistors are of opposite conductivity and the seventh and eighth transistors are of opposite conductivity.

9. The output buffer of claim 7 wherein the voltage limiting circuit further comprises:
 fifth, sixth, seventh and eighth transistors wherein the fifth and sixth transistors are coupled in series between the first and third transistors, the seventh and eighth transistors being coupled in series between the second and fourth transistors, the fifth, sixth, seventh and eighth transistors are each biased by a separate bias voltage.

10. The output buffer of claim 7 wherein the voltage limiting circuit further comprises:
 fifth, sixth, seventh and eighth transistors biased by the at least one bias voltage from the bias voltage generator, wherein the fifth and sixth transistors are coupled in series between the first and third transistors, the seventh and eighth transistors being coupled in series between the second and fourth transistors, the fifth and sixth transistors are of opposite conductivity and the seventh and eighth transistors are of opposite conductivity.

11. The output buffer of claim 7 further comprising:
 bypass circuitry coupled between the second current electrode of the first transistor and first current electrode of the third transistor and coupled between the second current electrode of the second transistor and the first current electrode of the fourth transistor, the bypass circuitry electrically bypassing the voltage limiting circuit in response to the first and second supply voltages having a same potential, thereby minimizing power consumption and increasing speed of operation.

12. The output buffer of claim 7 further comprising:

voltage pull-up circuitry coupled in parallel with each of the first and second transistors, the voltage pull-up circuitry controlling voltage potential at each of the second current electrodes of the first and second transistors and compensating for charge leakage from at each of the second current electrodes of the first and second transistors.

13. The output buffer of claim 6 wherein the reference voltage is a ground potential.

14. The output buffer of claim 6 wherein the output stage further comprises:

a plurality of output drive transistors coupled in series, at least one of the plurality of output drive transistors being of the first conductivity type and at least another of the plurality of output drive transistors being of the second conductivity type; and first and second series-connected resistors connected to an output terminal which provides the output signal, the first and second series-connected resistors limiting current through the output stage and protecting the plurality of output drive transistors from excessive voltage.

15. The output buffer of claim 5 wherein the bias voltage generator provides a plurality of bias voltages to the voltage level translator.

16. The output buffer of claim 5 wherein the bias voltage generator further comprises:

biasing transistors which provide a predetermined percentage of the first supply voltage at a bias voltage terminal and in response to the bias voltage select signal; and charge redistribution circuitry coupled to the bias voltage terminal for selectively and quickly boosting and pulling down voltage potential at the bias voltage terminal.

17. An output buffer comprising:

an input stage for being powered by a first and a second power supply voltage referenced to a ground potential, the second power supply voltage having a voltage magnitude greater than the first power supply voltage and the second power supply voltage is the voltage magnitude of one logic state of an output of the output buffer, the first power supply voltage not exceeding a predetermined control electrode dielectric breakdown voltage limit and the second power supply voltage exceeding the predetermined control electrode dielectric breakdown voltage limit, the input stage having a data input terminal and an enable signal which places the input stage in one of two operating voltage modes, the input stage providing a first drive output signal for driving transistors of a first conductivity type and providing a second drive output signal for driving transistors of a second conductivity type, the input stage being implemented with transistors which each has a control electrode dielectric breakdown voltage limit not exceeding the predetermined control electrode dielectric breakdown voltage limit;

a decoder having an input for receiving a control signal which indicates which one of a plurality of supply voltage levels is being selected to operate the output buffer with in response to a voltage value select signal provided in response to a user of the output buffer;

a bias generator coupled to the decoder, the bias generator providing at least one bias signal to the input stage, the at least one bias signal having a voltage magnitude selected in response to the control signal and which will not exceed a value which would harm any gate dielectric voltage breakdown voltage of any transistor in the output buffer; and an output stage coupled to the input stage for receiving the first and second drive output signals, and coupled to the bias generator, the output stage providing the output of the output buffer which is a voltage translation of an input signal received at the data input terminal.

18. The output buffer of claim 17 wherein the output stage further comprises:

a plurality of output drive transistors coupled in series, at least one of the plurality of output drive transistors being of the first conductivity type and at least another of the plurality of output drive transistors being of the second conductivity type; and first and second series-connected resistors connected to an output terminal which provides the output of the output buffer, the first and second series-connected resistors limiting current through the output stage and protecting the plurality of output drive transistors from excessive voltage.

19. The output buffer of claim 17 wherein the bias generator further comprises:

biasing transistors which provide a predetermined percentage of the first power supply voltage at a bias voltage terminal in response to the control signal; and charge redistribution circuitry coupled to the bias voltage terminal for selectively and quickly boosting and pulling down voltage potential at the bias voltage terminal.

* * * * *